United States Patent [19]
Laramie

[11] Patent Number: 6,005,410
[45] Date of Patent: Dec. 21, 1999

[54] INTERCONNECT STRUCTURE BETWEEN HETEROGENEOUS CORE REGIONS IN A PROGRAMMABLE ARRAY

[75] Inventor: Michael J. Laramie, Underhill, Vt.

[73] Assignee: International Business Machines Corporation, Armonk, N.Y.

[21] Appl. No.: 08/761,037

[22] Filed: Dec. 5, 1996

[51] Int. Cl.$^6$ .......................... H03K 19/177; H01L 25/00
[52] U.S. Cl. .................. 326/39; 326/41; 326/38
[58] Field of Search ................ 326/39, 40, 41, 326/38, 37

[56] References Cited

U.S. PATENT DOCUMENTS

| | | | |
|---|---|---|---|
| 4,758,985 | 7/1988 | Carter | 365/94 |
| 4,780,846 | 10/1988 | Tanabe et al. | 365/63 |
| 4,825,414 | 4/1989 | Kawata | 326/40 |
| 4,870,302 | 9/1989 | Freeman | 326/41 |
| 4,992,680 | 2/1991 | Benedetti et al. | |
| 5,036,473 | 7/1991 | Butts et al. | 364/489 |
| 5,258,668 | 11/1993 | Cliff et al. | 326/41 |
| 5,260,611 | 11/1993 | Cliff et al. | 326/41 |
| 5,361,373 | 11/1994 | Gilson | 395/800 |
| 5,371,422 | 12/1994 | Patel et al. | 326/41 |
| 5,376,844 | 12/1994 | Pedersen et al. | 326/41 |
| 5,377,123 | 12/1994 | Hyman | 364/489 |
| 5,426,379 | 6/1995 | Trimberger | 326/39 |
| 5,436,575 | 7/1995 | Pedersen et al. | 326/40 |
| 5,452,231 | 9/1995 | Butts et al. | 364/489 |
| 5,469,003 | 11/1995 | Kean | 326/39 |
| 5,493,239 | 2/1996 | Zlotnick | 326/38 |
| 5,500,609 | 3/1996 | Kean | 326/41 |
| 5,548,228 | 8/1996 | Madurawe | 326/41 |
| 5,550,782 | 8/1996 | Cliff et al. | 326/40 |
| 5,570,040 | 10/1996 | Lytle et al. | 326/41 |
| 5,572,148 | 11/1996 | Lytle et al. | 326/41 |
| 5,640,107 | 6/1997 | Kruse | 326/38 |
| 5,644,251 | 7/1997 | Colwell et al. | 326/39 |
| 5,689,195 | 11/1997 | Cliff et al. | 326/41 |
| 5,705,938 | 1/1998 | Kean | 326/39 |
| 5,744,980 | 4/1998 | McGowan et al. | 326/40 |
| 5,757,207 | 5/1998 | Lytle et al. | 326/39 |
| 5,789,938 | 8/1998 | Erickson et al. | 326/40 |

*Primary Examiner*—Michael Tokar
*Assistant Examiner*—Daniel D. Chang
*Attorney, Agent, or Firm*—Heslin & Rothenberg, P.C.

[57] ABSTRACT

A programmable interconnect structure is provided whereby core regions of an integrated circuit having circuits of different functional types therein are connected. Ports are defined in a first core region along its boundary with a second core region, and port multiplexers selectively provide signals to the first core region from a variety of conductors in the second core region. In the case where a core region of a first type is placed between two core regions of a second type, a segmented bus structure is provided to preserve connectivity between the two core regions of the second type, while at the same time providing an increased number of independent signals available to the core region of the first type. In the exemplary integrated circuit disclosed herein, a field programmable gate array occupies one core region, and a field programmable memory array occupies another core region.

14 Claims, 9 Drawing Sheets fig. 1 fig. 2 fig. 3 fig. 4 fig. 5 fig. 6 fig. 7 fig. 8 fig. 9 fig. 10

INTERCONNECT STRUCTURE BETWEEN HETEROGENEOUS CORE REGIONS IN A PROGRAMMABLE ARRAY

RELATED APPLICATION INFORMATION

This application relates to the following commonly assigned, co-pending U.S. Patent Applications:

Application Ser. No. 08/575,312, entitled "Field Programmable Memory Array," filed Dec. 20, 1995;

Application Ser. No. 08/459,579, entitled "Programmable Array Interconnect Network," filed Jun. 2, 1995;

Application Ser. No. 08/459,156, entitled "Programmable Array Clock/Reset Resource," filed Jun. 2, 1995;

Application Ser. No. 08/460,420, entitled "Programmable Array I/O -Routing Resource," filed Jun. 2, 1995; and Application Ser. No. 08/460,481, entitled "Programmable Logic Cell," filed Jun. 2, 1995.

Each of these applications is hereby incorporated by reference herein in its entirety.

TECHNICAL FIELD

This invention relates in general to integrated circuit devices. More particularly, this invention relates to programmable integrated circuit devices having a plurality of programmable logic cells and a programmable interconnect network, and including a core region having circuits therein of a functional type different than that of the logic cells.

BACKGROUND OF THE INVENTION

Programmable integrated circuits are known in the art and include programmable logic devices ("PLDs"), Programmable Array Logic ("PALs"), and Programmable Logic Arrays ("PLAs"). Each of these programmable circuits provides an input AND logic plane followed by an OR logic plane. An output function can thus be calculated which is the sum of the products of the input terms. The logic planes are usually programmable such that the initial general layout of the planes may be customized for a particular application.

A more general approach to programmable arrays involves providing an array of distinct, uncommitted logic cells in a Programmable Gate Array ("PGA"). A programmable interconnect network is provided to interconnect the cells, and to provide data input to, and output from, the array. Customization or programming of the otherwise generally-designed logic cells and interconnect network is performed for a particular application. One such array is a Mask Programmable Gate Array ("MPGA"), wherein the configuration of the cells and the wiring network occurs when adding the final layers of metallization to an integrated circuit. A modified approach involves the use of laser-directed energy to customize the metallization pattern. Another such array is a Field Programmable Gate Array ("FPGA"), wherein the configuration can be performed by a user, in the "field." Such configuration may be effected by using electrically programmable fusible links, antifuses, memory-controlled transistors, floating-gate transistors, or the like.

A third, emerging type of programmable circuit is disclosed in the above-incorporated U.S. Patent Application entitled, "Field Programmable Memory Array." A field programmable memory array ("FPMA") may include uncommitted sub-arrays of memory cells. The sub-arrays of memory cells can be arranged in a user-defined manner using, for example, programmable address units, programmable, hierarchical data bitline structures, and programmable I/O and clocking resources. Though the functional configuration of the memory sub-arrays may vary in a user-defined manner, the physical layout of the memory sub-arrays must be determined during the layout of the integrated circuit. Because of their repetitive nature, the memory sub-arrays will likely be laid out in a regular pattern.

Discussed in the "Field Programmable Memory Array" application was a combination of an FPGA and an FPMA in a single integrated circuit to provide both programmable processing resources and programmable memory resources to a user. To effect meaningful, functional cooperation between FPGA and the FPMA circuit regions, an interface between these two regions in the integrated circuit must be defined. This interface must be designed to provide the high level of node connectivity necessary to provide data, control, and clock/reset signals to or from the sub-arrays of memory cells of the FPMA.

The interconnect network of the logic cells in the FPGA, as well as the logic cells themselves, may require connection to the resources of the FPMA. However, because of the nature of an FPGA, connectivity between all of the logic cells thereof via the interconnect network is usually an important feature and should be maintained despite the placement of an FPMA region therein. Therefore, it is desirous to maintain programmable connectivity between the logic cells of FPGA region of the integrated circuit chip, while at the same time providing connectivity to the FPMA region of the chip.

Finally, the interface should be designed to minimize the physical layout changes of an existing circuit region (e.g., an FPGA) into which a new circuit region (e.g., an FPMA) is introduced.

Therefore, what is required is an interface whereby regions of an integrated circuit having different functional characteristics can be interconnected in a manner which maintains full interconnection of circuits within the regions themselves. The interface should provide the requisite level of interconnection between the two functionally different regions, and should be implemented without significantly impacting existing physical layouts of one region into which another region is being introduced.

SUMMARY OF THE INVENTION

A flexible interconnect structure is provided by the instant invention, which in one aspect relates to an interconnect structure for connecting programmable logic cells of a programmable array to a core region within the array, the core region being generally characterized by circuits therein of a functional type different than that of the logic cells. The interconnect structure includes a first row of ports for carrying signals to or from the core region and selectively connectable to logic cells of a first interior row of logic cells. At least some ports of the row of ports are positioned proximate a respective column of the logic cells and are selectively connectable to an interconnect bus associated with the column of logic cells.

In the case where the core region is disposed in the array between first and second regions of logic cells, wherein the first region of logic cells includes a first interior row of logic cells and the second region of logic cells includes a second interior row of logic cells, the interconnect structure includes a second row of ports for carrying signals to or from the core region and selectively connectable to logic cells of the second interior row of logic cells. At least some ports of the second row of ports are positioned proximate a respective column of logic cells and are selectively connectable to at least one interconnect bus associated with the column of logic cells.

Programmable port multiplexers are provided and are coupled between the interconnect bus and the ports for selectively transmitting signals between the ports and conductors of the interconnect bus. If the interior rows between which the core region is disposed includes cells having direct connect conductors, at least some of which connect the cells to other cells adjacent thereto, the programmable port multiplexers may also selectively couple such direct connect conductors to their respective ports.

In another aspect, the present invention relates to a programmable array having a first interconnect bus traversing first and second core regions therein and having associated therewith a first plurality of programmable devices. The devices are arranged in a substantially regular connection pattern along the bus for interconnecting connectors of the bus to each other and to circuits in the first and second core regions. A third core region is disposed between the first and second core regions and is characterized by circuits therein of a functional type different than the type of the circuits in the first and second core regions. The third core region includes a programmable element coupled between first and second portions of the first interconnect bus respectively contained within the first and second core regions. The programmable element is programmable into a first mode for connecting the first and second portions such that signals can be transmitted therebetween and therefore between the first and second core regions, and a second mode for isolating the first portion from the second portion of the bus such that a first signal can be transmitted between the first portion of the bus and the third core region, and a second signal can be independently transmitted between the second portion of the bus and the third core region. The coupling of the programmable element does not conform to the otherwise regular connection pattern of the programmable devices arranged along the interconnect bus.

The third core region may further include an intermediate portion of the interconnect bus disposed between the first and second portions thereof. In this case, the at least one programmable element includes first and second programmable elements, the first programmable element being coupled between the first portion of the bus and the intermediate portion of the bus, the second programmable element being coupled between the second portion of the bus and the intermediate portion of the bus. Each of the first and second programmable elements is programmable into a first mode connecting its respective coupled first bus portions, and a second mode isolating its respective coupled bus portions.

By providing the pattern of ports, programmable port multiplexers, and segmented interconnect bus portions within the core region, an effective interconnect structure is provided by the instant invention which maintains connectivity between the logic cells of a field programmable gate array intact, but which also provides the requisite connectivity into the core region having placed therein, for example, a field programmable memory array.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of the preferred embodiment(s) and the accompanying drawings in which:

DETAILED DESCRIPTION OF THE PREFERRED EMBODIMENT(s)

Figure 1:
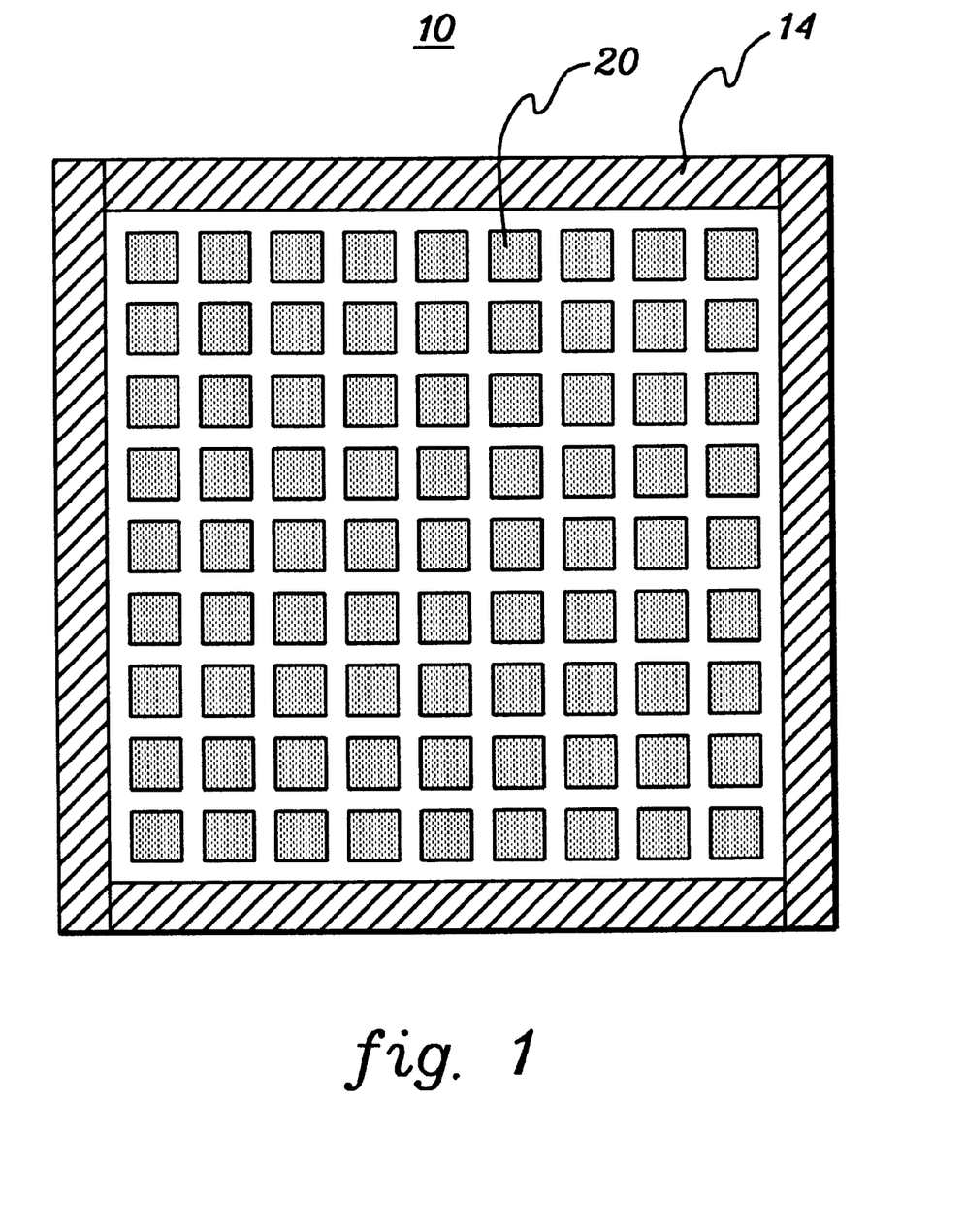
FIG. 1 depicts a programmable array having a plurality of logic cells arranged therein, the plurality of logic cells being arranged into sectors.

Disclosed herein is an interconnect structure for connecting core regions having circuits of different functional types therein. As discussed above, a first core region may have therein a programmable array of logic cells, possibly arranged into sectors. With reference to FIG. 1, shown therein is an exemplary layout of a programmable array 10 comprising a plurality of logic cells arranged into sectors 20. In this particular embodiment, the plurality of logic cells comprises a 72×72 array of cells arranged into sectors of cells, wherein each sector is defined by an 8×8 group of cells. The logic cells of the array can be implemented according to the above-incorporated U.S. Patent Application entitled "Programmable Logic Cell," or can be any type of known logic cells, including AND/OR macrocells as in PALs or PLAs. Also depicted are the input/output ("I/O") regions 14 along the perimeter of the array which are used for data input and output. The I/O regions 14 of the array can be implemented according to the above-incorporated U.S. Patent Application entitled "Programmable Array I/O Routing Resource."

Figure 2:
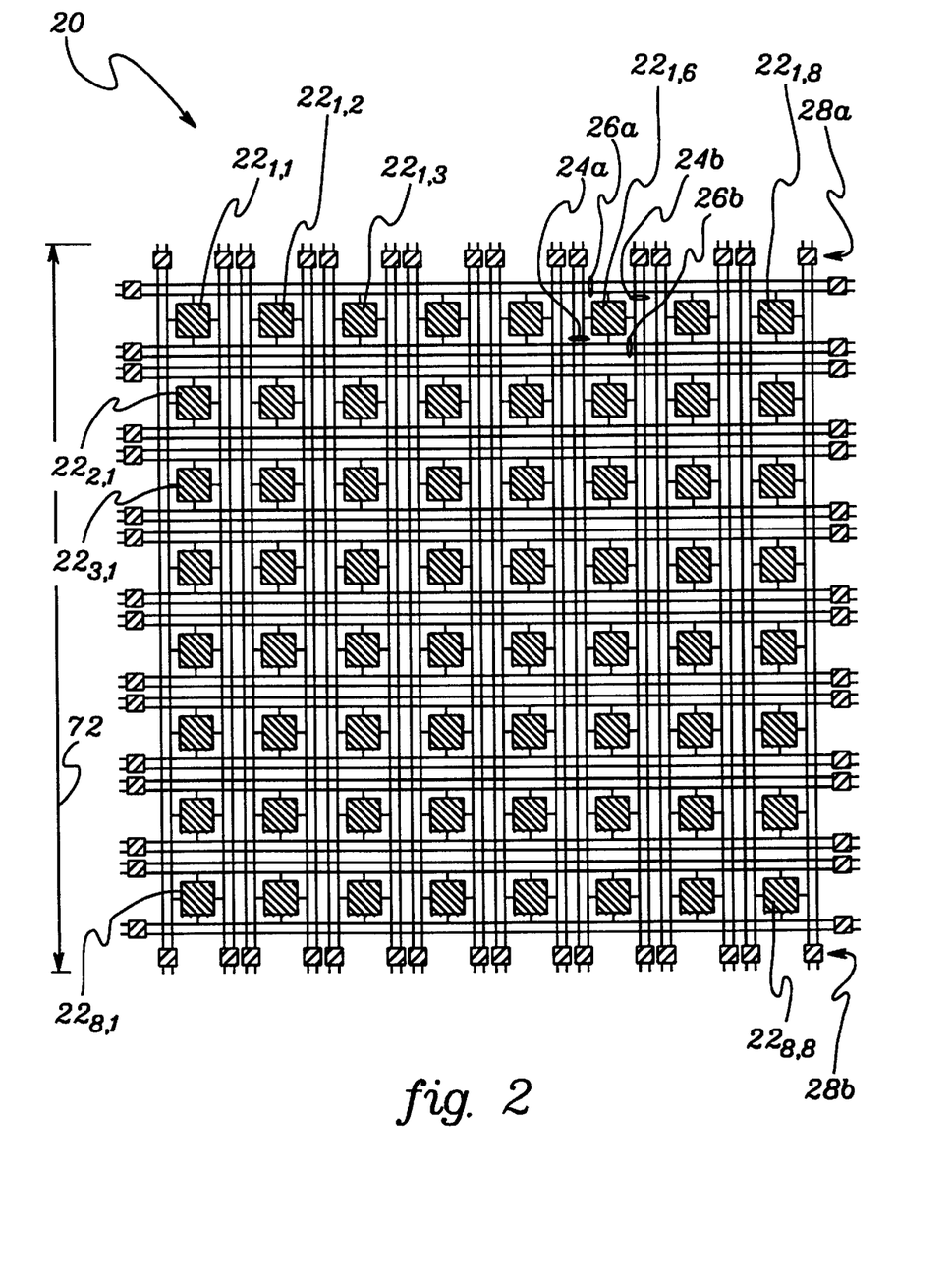
FIG. 2 depicts a single sector of logic cells of the array of FIG. 1.

With reference to FIG. 2, shown therein is the sector 20 of logic cells of the array of FIG. 1. A single sector comprises logic cells $22_{1,1}$ to $22_{8,8}$ arranged in rows and columns of contiguous, but not necessarily abutting, logic cells. With reference to logic cell $22_{1,6}$, the cell is shown generally surrounded by exemplary vertical interconnect buses 24a and 24b, and horizontal interconnect buses 26a and 26b. These horizontal and vertical interconnect buses run along rows and columns of the array and provide connections between any two logic cells in the array, or between any logic cell in the array and the I/O blocks. The above-incorporated U.S. Patent Application entitled "Programmable Array Interconnect Network" describes in greater detail this exemplary interconnect network. As used herein, a bus connotes a single conductor or a group of conductors, generally co-linearly arranged, which may be connected to other conductors or cells using programmable devices (e.g., programmable interconnect elements, multiplexers, switches or repeaters). The terms "adjacent" or "co-linear," when used herein when referring to conductors, denote conductors which, when connected together, form a functional, elongated bus. The individual conductors may or may not be precisely, physically co-linear in an actual implementation. The interconnect buses together form the overall programmable interconnect network of the programmable array. The regular placement of switches or repeaters 28a and 28b define the boundaries of each sector and are also another type of programmable device, and selectively provide signals between conductors of the same or nearby buses. Length 72 (in this example, 8 logic cells) therefore represents the length or width of a square sector.

Figures 3, 4:
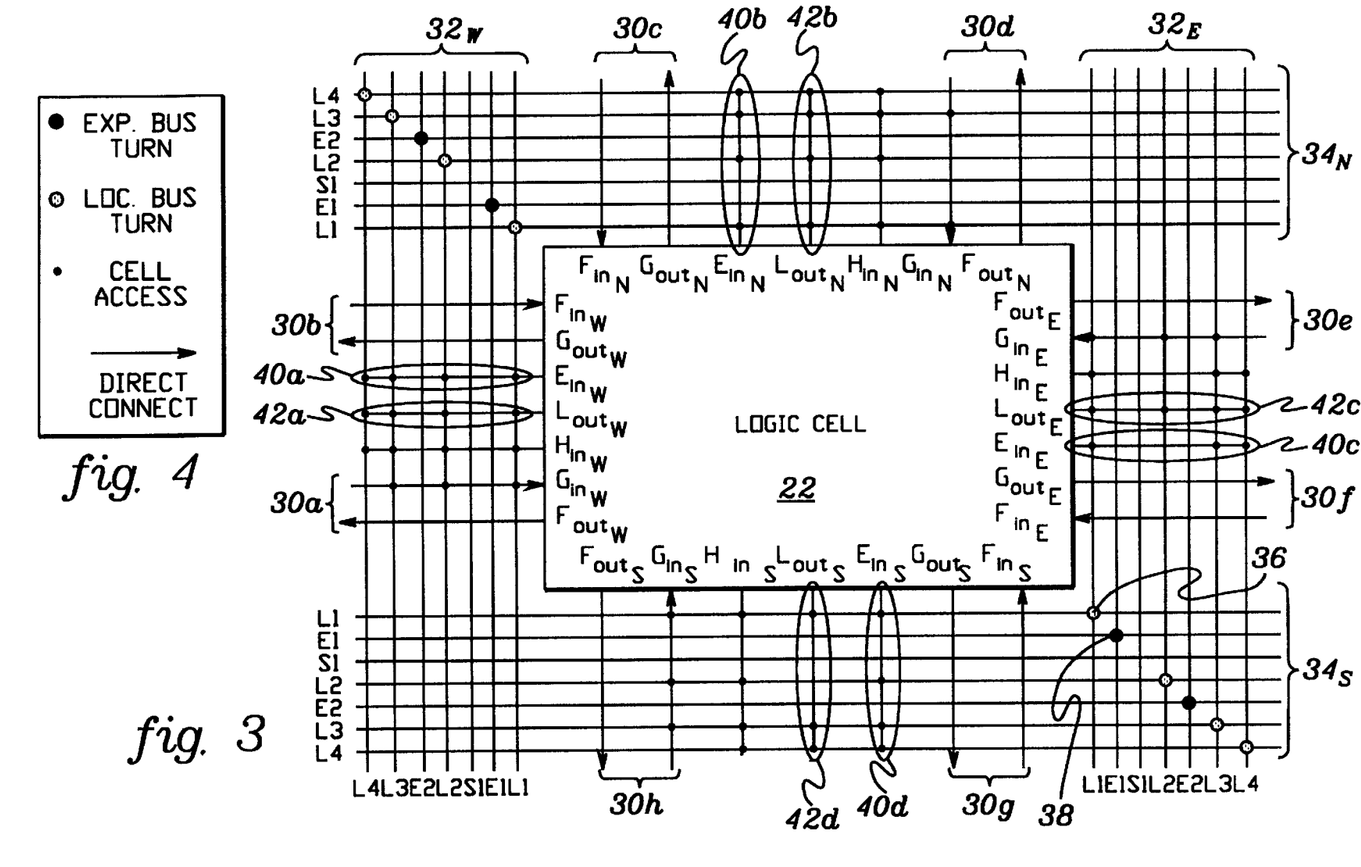
FIG. 3 depicts the groups of buses associated with a row of logic cells and the groups of buses associated with a column of logic cells intersecting at one logic cell.
FIG. 4 is a key to FIG. 3.

FIG. 3 depicts a selected logic cell 22 from the array of FIG. 1. The logic cell is simultaneously a member of a row of logic cells and a column of logic cells. The designation "row/column," when used alone herein, denotes either a row or a column. The designations "row/column" and "column/row," when used together herein, denote either (1) a row and a column, or (2) a column and a row. This convention is similarly used for other terms. Thus, the logic cell 22 is at the intersection of a row/column and a column/row of logic cells.

Associated with each row of logic cells may be two groups of buses, $34_N$ (north) and $34_S$ (south). Associated with each column of logic cells may be two groups of buses $32_W$ (west) and $32_E$ (east). At each logic cell, the buses associated with the row and column intersect and the programmable connections possible between the intersecting buses near the logic cells, and between the buses and the logic cell, are also depicted in FIG. 3. The intersection connections are referred to herein as bus turns, and their symbols are depicted in FIG. 4.

Each group of buses ($32_W$, $32_E$, $34_N$ or $34_S$) may include four local buses ("L"), two express buses ("E"), and one super bus ("S"). Thus, two groups of at least seven buses are employed for each row or column of logic cells in the array. The structure depicted in FIG. 3 therefore may exist for each of the logic cells in the array.

Logic cell 22 can be formed in accordance with the above-incorporated U.S. Patent application entitled "Programmable Logic Cell." Briefly summarized, the logic cell includes four input nodes designated $E_{in}$, $F_{in}$, $G_{in}$ and $H_{in}$, and two output nodes, designated $F_{out}$ and $G_{out}$. In addition to the F and G output nodes, an L output node is also provided for providing signals from either the F or G output nodes to the local buses L of the interconnect network. The local buses are selectively connectable to the input nodes of logic cell 22. These connections include inputs from any of the local buses in any of the four groups $32_W$, $32_E$, $34_N$ and $34_S$. For example, local buses from each of these groups are shown connectable to the $E_{in}$ node in regions 40a–d. The $E_{in}$ node actually includes a programmable multiplexer selecting from the 15 potential local bus input signals depicted in regions 40. A similar level of connectivity can be provided to the F, G and H input nodes, and exemplary connections are depicted in FIG. 3. In addition to the level of input access, a level of output access is similarly provided. This level of output access includes output connections from the $L_{out}$ node depicted in regions 42a–d. The $L_{out}$ node similarly comprises a multiplexer capable of applying a signal to any of the local buses of groups $32_W$ and $32_E$, and $34_N$ and $34_S$. Also depicted are direct connect conductors 30a–h. These conductors normally provide direct connections from adjacent logic cells to the F and G input nodes, and from the F and G output nodes to adjacent logic cells.

The E and S buses are not connectable to, i.e., are electrically isolated from, logic cells because their use is reserved for signals requiring longer or faster signal paths within the interconnect network.

Also depicted in FIG. 3 are programmable interconnections between vertical group $32_W$ and horizontal group $34_N$, and between vertical group $32_E$ and horizontal group $34_S$. For example, a programmable element or bus turn 36 is available between the corresponding intersecting L1 conductors of groups $32_E$ and $34_S$. A similar programmable element is provided for each of the corresponding intersecting local buses. Similarly, a programmable element or bus turn 38 is provided for the intersecting E1 buses of groups $32_E$ and $34_S$. A similar programmable element is also available for the intersecting E2 buses. FIG. 4 is a key to the symbols used in FIG. 3. In a preferred embodiment, the bus turns are transmission gates controlled by SRAM cells.

Upon an examination of FIGS. 1–4, and their associated discussions above, it is evident that the interconnect buses, e.g., buses 24a of FIG. 2 or buses 32 or 34 of FIG. 3, have placed along their length a plurality of programmable devices for either connecting the conductors of the bus to each other, the conductors of the bus to other buses, or the conductors of the bus to the logic cells. These programmable devices may take the form of switches or repeaters (e.g., 28a,b in FIG. 2) bus turns (e.g., 36, 38 in FIG. 3) or multiplexers (e.g., 40, 42 in FIG. 3). It will be further understood by those skilled in the art that these programmable devices are coupled to a respective interconnect bus in a generally regular pattern along its length in the array, assuming that there is no interruption in the general pattern of the array of logic cells.

Figure 5:
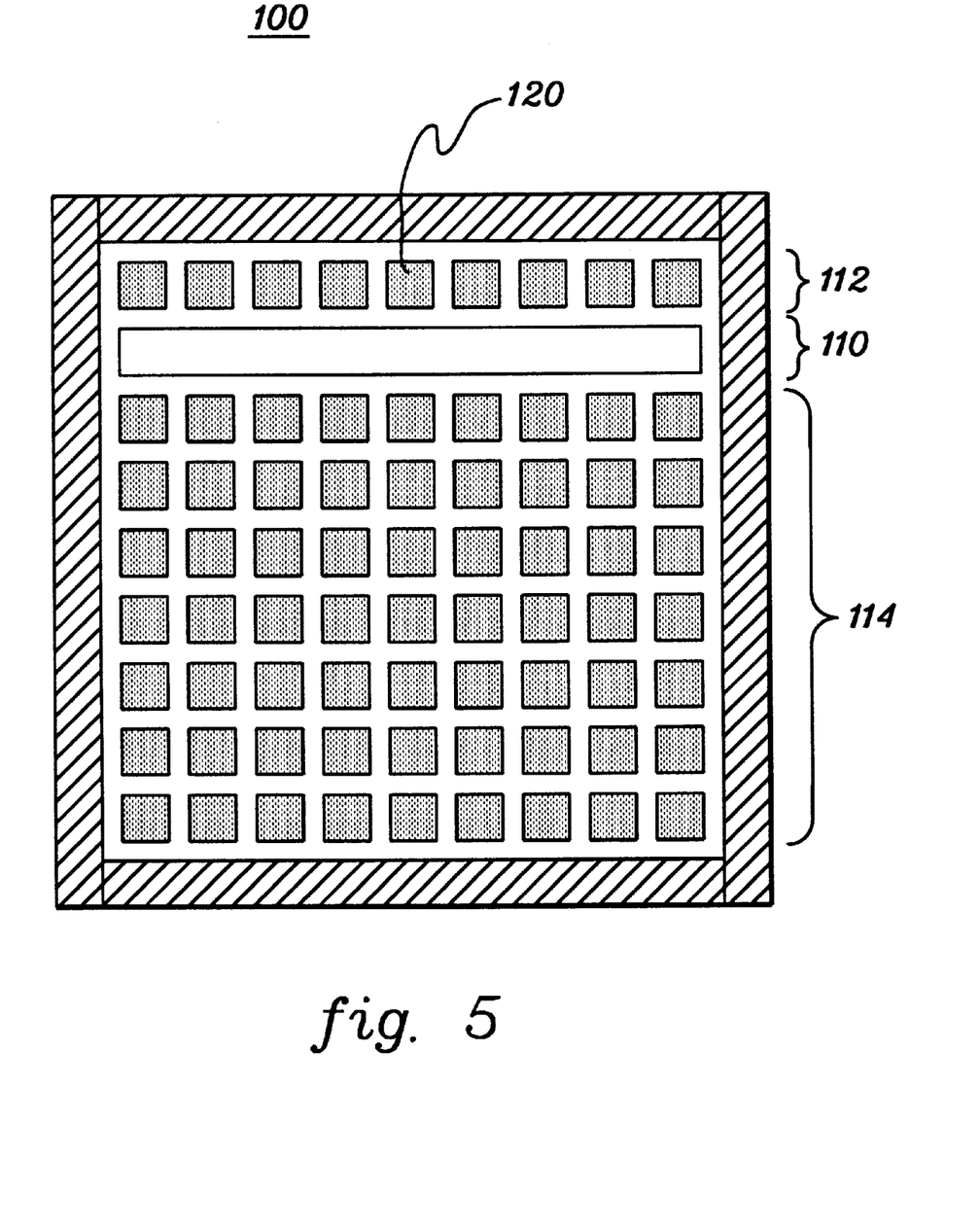
FIG. 5 depicts an integrated circuit having therein two regions of logic cells, separated by a region containing a programmable memory array, in accordance with the present invention.

In accordance with the instant invention, and with reference to FIG. 5, an improved programmable array 100 is provided which has regions of logic cells 112 and 114, separated by a region 110 containing a field programmable memory array ("FPMA"). The FPMA may be implemented according to the above-incorporated U.S. Patent Application entitled "Field Programmable Memory Array." The placement of the FPMA region 110 in FIG. 5 effectively constitutes a replacement of a horizontal row of 9 sectors of logic cells.

Figure 6:
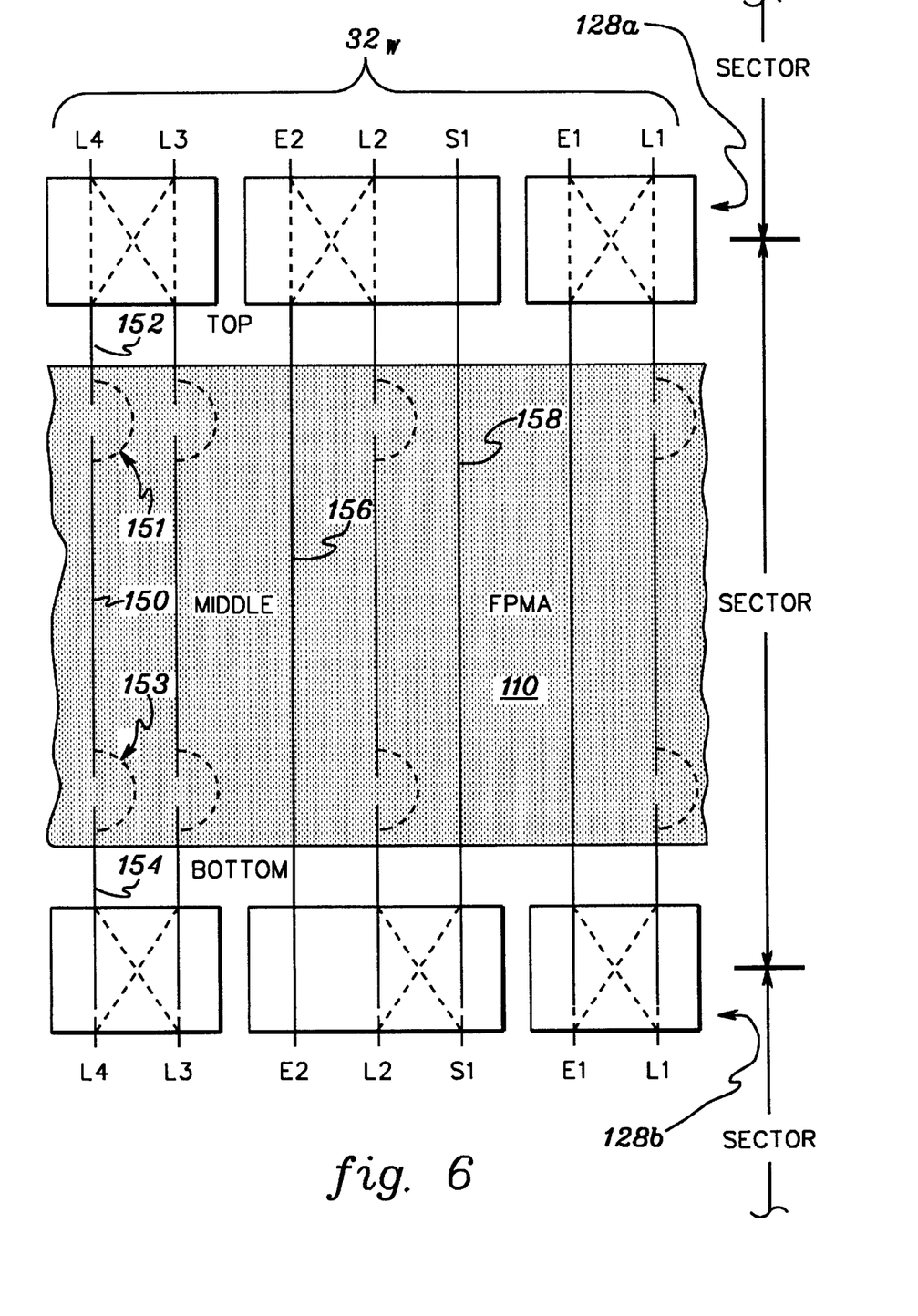
FIG. 6 depicts in greater detail the replacement of a sector of logic cells with a programmable memory array, and the manner in which the interconnect buses of the programmable gate array traverse through the programmable memory array.

With reference to FIG. 6, a portion of FPMA region 110 is depicted in relation to the west interconnect buses $32_W$ discussed with reference to FIG. 3 above. As discussed above, a sector in this exemplary architecture corresponds to the logic cells separated by regions of repeating circuits 128a and 128b. This pattern of switching or repeating circuits is not interrupted, rather the switches or repeaters 128a and 128b are maintained. Further, the integrity of the bus structure $32_W$ as a whole is maintained despite the replacement of a sector of logic cells with FPMA region 110. However, according the instant invention, certain modifications are made to some of the buses to effect a more useful interface between the buses and the FPMA region. The express bus (e.g., 156) and the super bus (e.g., 158) remain unaffected, and their conductors traverse the FPMA region without interruption in a manner similar to the way they traverse other core cell sectors without interruption. Access to the express and super buses is provided solely by the switching or repeating circuits 128a and 128b.

However, as discussed above, it is the local buses L1–L4 which effect signal transfer directly to and from logic cells. In accordance with this invention, the local buses, for example L4, are segmented, for example, into "top" portion 152, "middle" or intermediate portion 150, and "bottom" portion 154 as they traverse the FPMA region. Programmable elements 151 and 153 (for example, transmission gates controlled by SRAM configuration memory cells) are also provided and each operate in a first mode connecting their respective connected portions of the interconnect bus, or a second mode isolating their respective connected portions of the interconnect bus. Therefore, the local buses, when the programmable elements are connected, can carry signals which traverse from the upper sector to the lower sector of logic cells without interruption at the FPMA region. Alternatively, the signal paths may be broken, and signals independently transmitted into the FPMA region from both the upper sector and the lower sector via the top portion of L4 152 and the bottom portion of L4 154, thereby effectively doubling the number of different signals available to the FPMA from the FPGA. This segmentation and programmable element structure may be replicated for each of the local buses L1–L4 in the exemplary embodiment depicted in FIG. 6. Of course, only a single break, or multiple breaks (2 disclosed herein) can provide this capability. However, the middle or intermediate portion disclosed herein can be laid out in the FPMA core region itself and then easily connected (via jumpers) to the top and bottom portions, which are laid out in the existing FPGA. This results in design time savings, and still maintains all connectivity between the regions of the FPGA.

Figure 7:
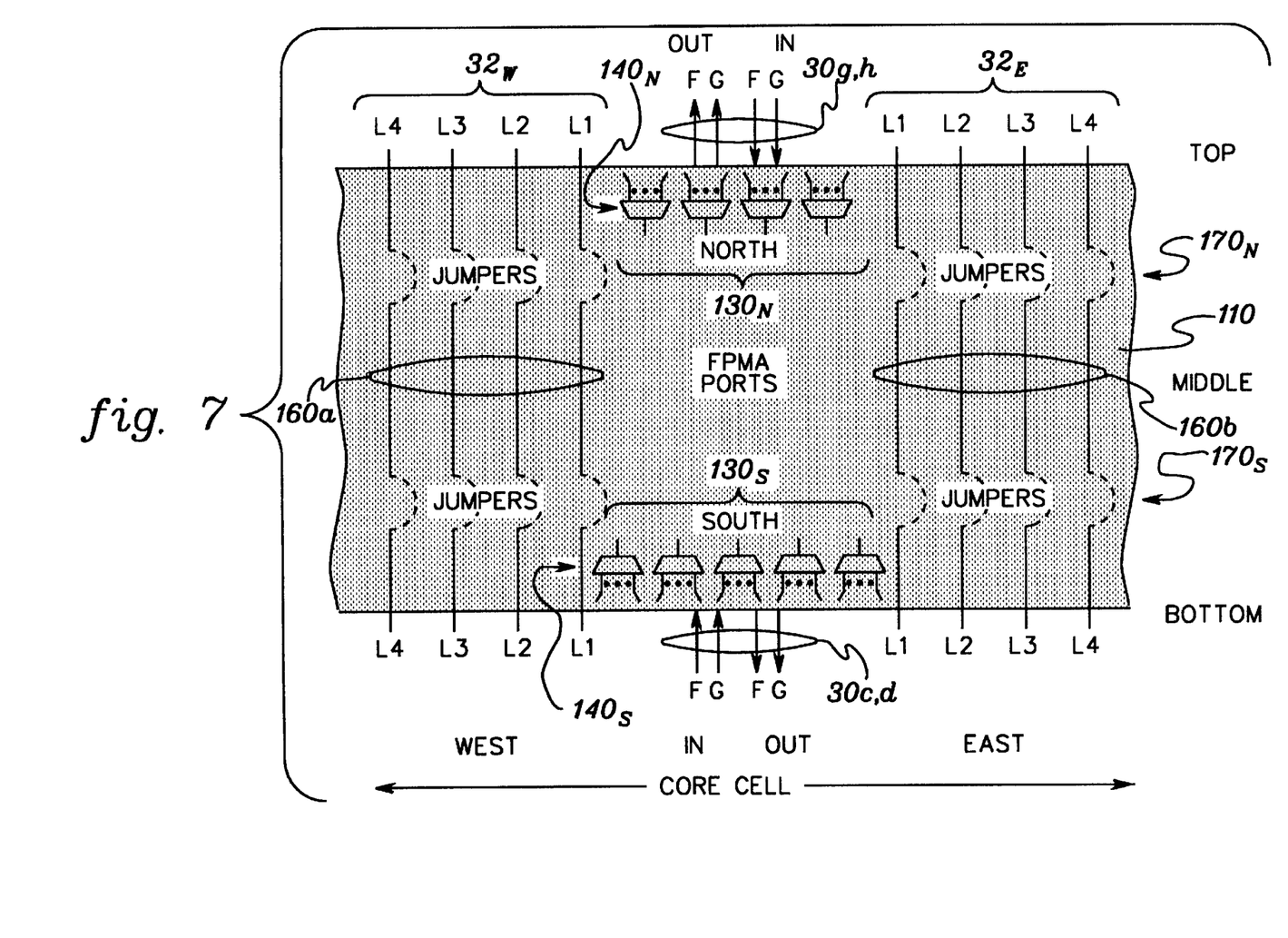
FIG. 7 depicts the conductors of a respective column or row of logic cells to which programmable memory array ports are connected via programmable port multiplexers in accordance with the present invention.

With reference to FIG. 7, shown therein are both the west group ($32_W$) and the east group ($32_E$) of local interconnect buses associated with a column of logic cells. Further, depicted therein are the F and G direct connect conductors $30g,h$ and $30c,d$ connected to the logic cells immediately above and immediately below the intervening FPMA region 110, respectively. Consistent with the discussion above with reference to FIG. 6, depicted in FIG. 7 are an upper set of jumpers $170_N$ and a set of lower jumpers $170_S$ which effect the programmable connection between intermediate portions 160a and 160b of the local interconnect buses and their respective upper or lower portions.

With continued reference to FIG. 7, shown therein are four north FPMA ports $130_N$ and five south FPMA ports $130_S$, each of the ports for carrying signals to or from the circuits within the FPMA region 110. In accordance with the present invention, connected between these FPMA ports and many of the conductors depicted are groups of programmable port multiplexers $140_N$ and $140_S$.

FIG. 7 shows the connections possible for only one column of logic cells, and the interconnect buses associated with that column, however, those skilled in the art will appreciate that the circuits in FIG. 7 can be replicated in a regular pattern across the FPMA region and therefore across major portions of, or the entire array of FIG. 5. Although the number of ports and corresponding multiplexers may vary for a particular implementation, for the implementation disclosed in FIG. 7 a total of 72 ports and multiplexers is possible for each sector of width 8 logic cells, and assuming a one to one correspondence between sectors and memory sub-arrays, 72 FPMA ports are therefore provided for each sub-array.

Figure 8:
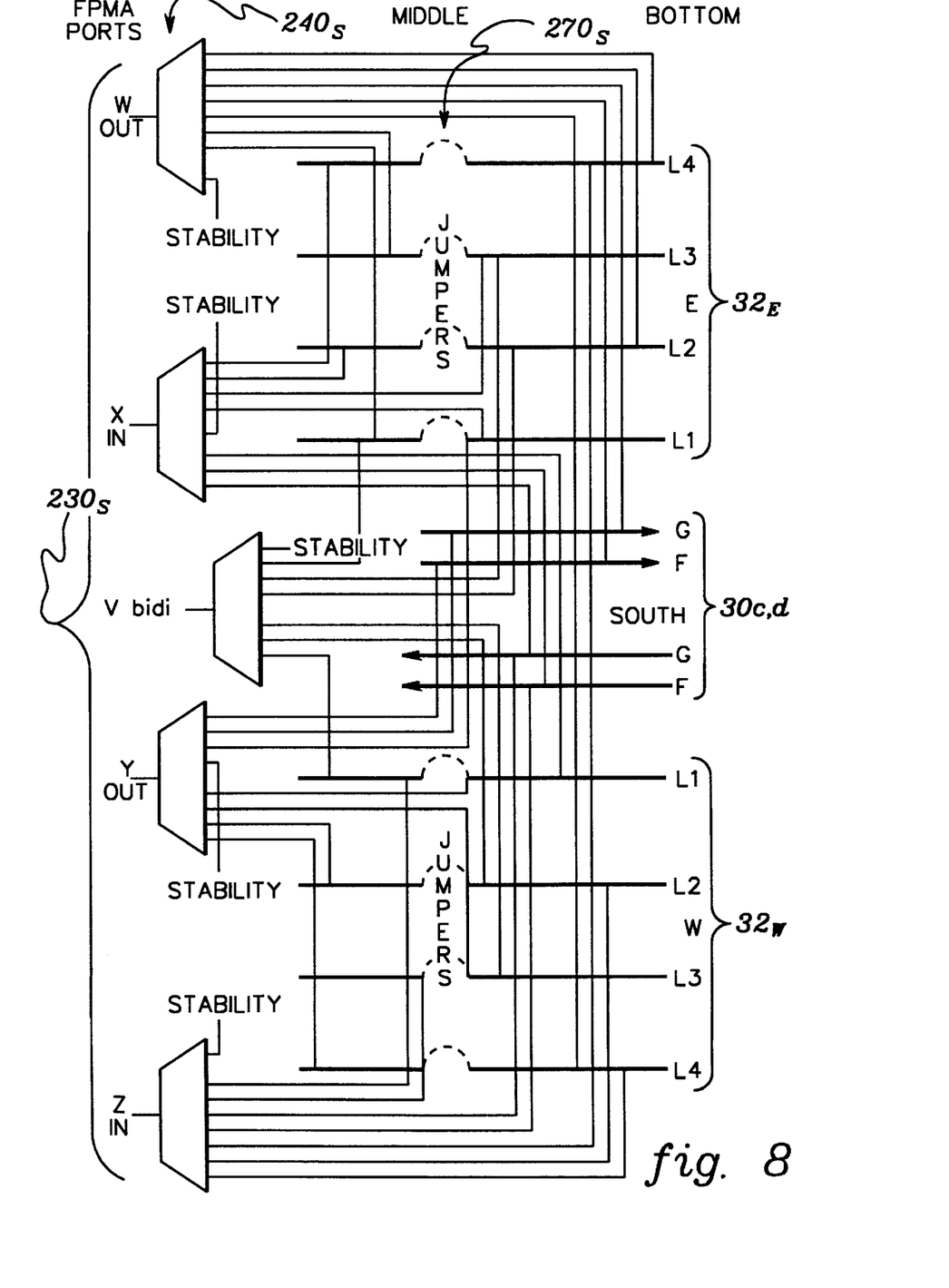
FIG. 8 depicts the programmable connectivity between programmable memory array data input/output ports and programmable gate array conductors via programmable port multiplexers in accordance with the present invention.
Figure 9:
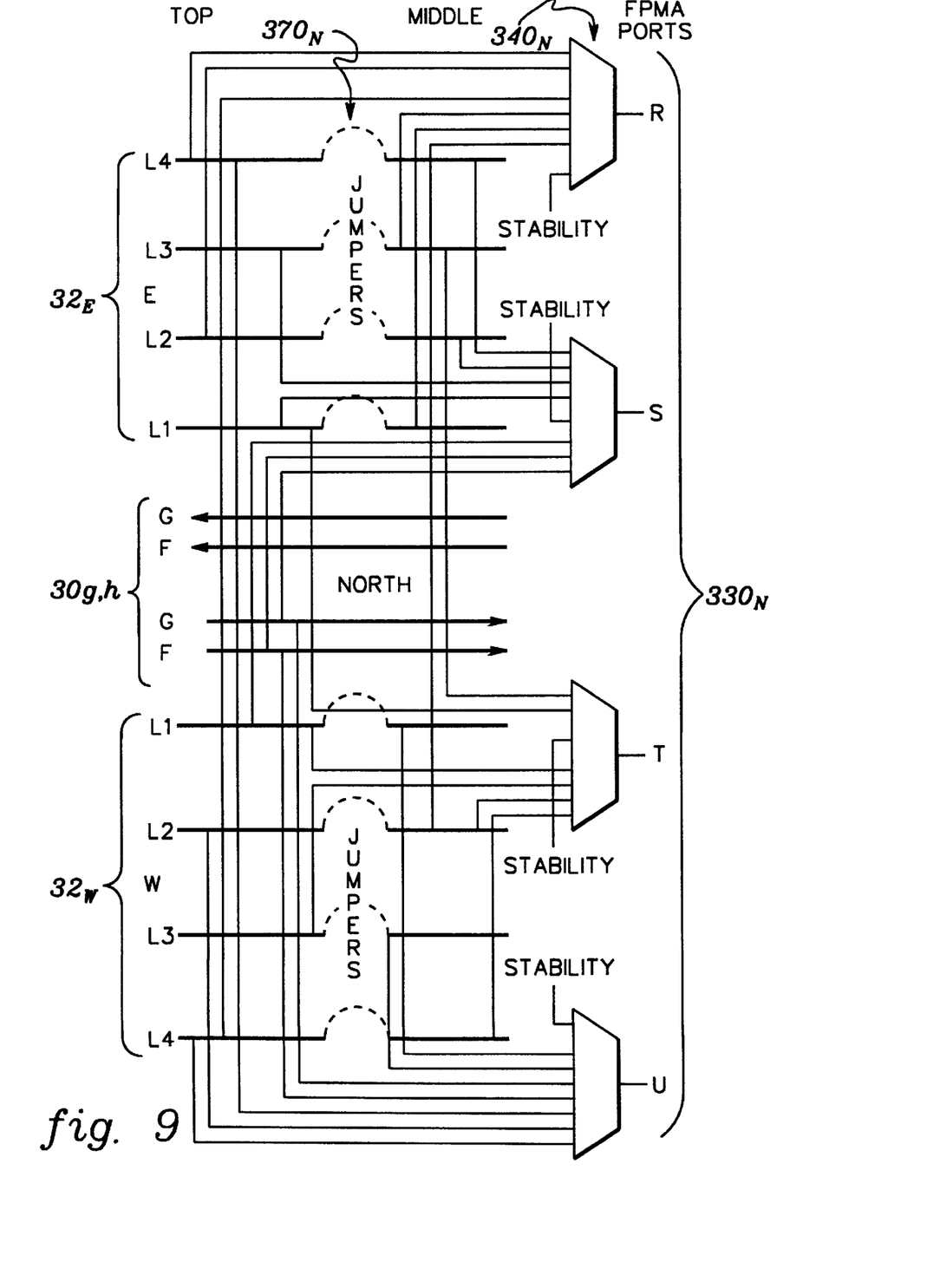
FIG. 9 depicts the programmable connectivity between programmable memory array control ports and programmable gate array conductors via programmable port multiplexers in accordance with the present invention.
Figure 10:
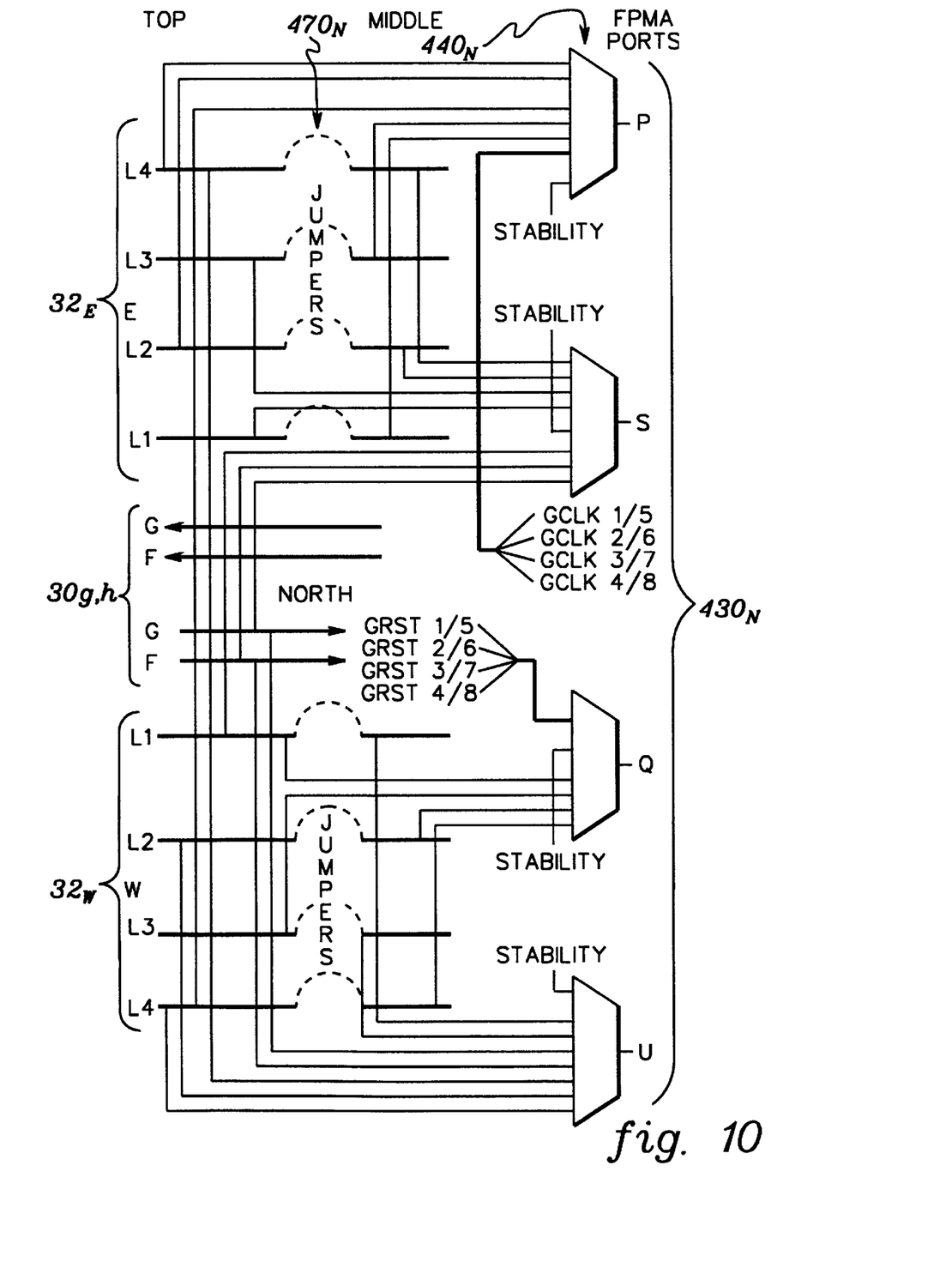
FIG. 10 depicts the programmable connectivity between programmable memory array clock/reset ports and programmable gate array conductors via programmable port multiplexers in accordance with the present invention.

The level of connectivity provided between the ports and the FPGA conductors shown in FIG. 7 is detailed in FIGS. 8–10, with connection maps presented in Tables 1–5.

Ports are grouped at the cell level into three different types:

Data In/Out (DIO) Port Group—5 Ports
W (out)—Output Port
X (in)—Input Port
V (bidi)—Either an Output Port or an Input Port
Y (out)—Output Port
Z (in)—Input Port
Control Signal (CS) Port Group—4 Ports
R—Input Port
S—Input Port
T—Input Port
U—Input Port
Clock/Reset (CLKRES) Port Group—4 Ports
P—Clock Input Port
S—Input Port
Q—Reset Input Port
U—Input port Table 1 contains a map of how the three different types of port groups (data DIO, control CS and clock/reset CLKRES) are positioned along the top and bottom edges of the FPMA region within a single sector of logic cells. Table 2 contains a map of additional control and data ports.

Further, with reference to FIG. 8, shown therein are the selective connections possible through a single group of 5 programmable port multiplexers $240_S$ to corresponding data in/out ports of port group $230_S$ (V, W, X, Y and Z). For each port a corresponding multiplexer is provided, and the conductors which can be selectively coupled to the corresponding port are depicted in FIG. 8. For each multiplexer, a wide range of connection possibilities is provided to F and G direct connect conductors $30c,d$, as well as to the middle and bottom portions of the local bus conductors $32_W$ and $32_E$. Table 3 contains this connection map. As discussed above, programmable elements or jumpers $270_S$ are provided to connect respective ones of the middle and bottom portions of the local interconnect buses $32_W$ and $32_E$.

With reference to FIG. 9, shown therein are the selective connections possible through a single group of 4 programmable port multiplexers $340_N$ to corresponding control ports of port group $330_N$ (R, S, T, and U). For each port a corresponding multiplexer is provided, and the conductors which can be selectively coupled to the corresponding port are depicted in FIG. 9. Again, for each multiplexer, a wide range of connection possibilities is provided to F and G direct connect conductors $30g,h$, as well as to the middle and top portions of the local bus conductors $32_W$ and $32_E$. Table 4 contains this connection map. As discussed above, programmable elements or jumpers $370_N$ are provided to connect respective ones of the middle and top portions of the local interconnect buses $32_W$ and $32_E$.

With reference to FIG. 10, shown therein are the selective connections possible through a single group of 4 programmable port multiplexers $440_N$ to corresponding clock/reset ports of port group $430_N$ (P, S, Q, and U). For each port a corresponding multiplexer is provided, and the conductors which can be selectively coupled to the corresponding port are depicted in FIG. 10. Again, for each multiplexer, a wide range of connection possibilities is provided to F and G direct connect conductors 30g,h, as well as to the middle and top portions of the local bus conductors 32$_W$ and 32$_E$. Table 5 contains this connection map. As discussed above, programmable elements or jumpers 470$_N$ are provided to connect respective ones of the middle and top portions of the local interconnect buses 32$_W$ and 32$_E$.

Also shown in FIG. 10 are GCLK and GRST clock and reset signals routed from column conductors of a clock/reset structure in the FPGA. Such a structure is disclosed in the above-incorporated U.S. Patent Application entitled "Programmable Array Clock/Reset Resource."

The interconnect structure herein effects the above-discussed requirements of providing a high level (density) of connectivity into the FPMA core region, preserving the connectivity within the FPGA, and also has the advantage of supporting current layouts of the FPGA when the FPMA is to be placed into an existing FPGA.

TABLE 1

FPMA Port Map

| | Top | | | | Bottom | | |
|---|---|---|---|---|---|---|---|
| Group | Port Type | Port Function | Placement in Array | | Port Function | Port Type | Group |
| CS | R | :::Not Used::: | | | RDATA 00 | W | DIO |
| | S | WADDR 0 | FPGA | | WDATA 16 | X | |
| | | | Core | | WDATA 17 | V | |
| | T | WADDR 7 | Cell | | RDATA 01 | Y | |
| | U | WADDR 1 | | | WDATA 15 | Z | |
| CS | R | WADDR 8 | | | RDATA 02 | W | DIO |
| | S | WADDR 2 | FPGA | | WDATA 14 | X | |
| | | | Core | | :::Not Used::: | V | |
| | T | WADDR 9 | Cell | | RDATA 03 | Y | |
| | U | WADDR 3 | | | WDATA 13 | Z | |
| CLKRES | P | WCLK | | | RDATA 04 | W | DIO |
| | S | WADDR 4 | FPGA | | WDATA 12 | X | |
| | | | Core | | :::Not Used::: | V | |
| | Q | :::Not Used::: | Cell | | RDATA 05 | Y | |
| | U | WADDR 5 | | | WDATA 11 | Z | |
| CS | R | WEN 1 | | | RDATA 06 | W | DIO |
| | S | WADDR 6 | FPGA | | WDATA 10 | X | |
| | | | Core | | RDATA 08 | V | |
| | T | WEN 2 | Cell | FPMA | RDATA 07 | Y | |
| | U | :::Not Used::: | | Sub- | WDATA 09 | Z | |
| CS | R | :::Not Used::: | | Array | RDATA 09 | W | DIO |
| | S | RADDR 0 | FPGA | | WDATA 07 | X | |
| | | | Core | FPGA | WDATA 08 | V | |
| | T | RADDR 7 | Cell | Sector | RDATA 10 | Y | |
| | U | RADDR 1 | | | WDATA 06 | Z | |
| CS | R | RADDR 8 | | | RDATA 11 | W | DIO |
| | S | RADDR 2 | FPGA | | WDATA 05 | X | |
| | | | Core | | :::Not Used::: | V | |
| | T | RADDR 9 | Cell | | RDATA 12 | Y | |
| | U | RADDR 3 | | | WDATA 04 | Z | |
| CLKRES | P | RCLK | | | RDATA 13 | W | DIO |
| | S | RADDR 4 | FPGA | | WDATA 03 | X | |
| | | | Core | | :::Not Used::: | V | |
| | Q | RES | Cell | | RDATA 14 | Y | |
| | U | RADDR 5 | | | WDATA 02 | Z | |

TABLE 1-continued

FPMA Port Map

| | Top | | | Bottom | | |
|---|---|---|---|---|---|---|
| Group | Port Type | Port Function | Placement in Array | Port Function | Port Type | Group |
| CS | R | Not Used | | RDATA 15 | W | DIO |
| | S | RADDR 6 | FPGA Core | WDATA 01 RDATA 17 | X V | |
| | T | Not Used | Cell | RDATA 16 | Y | |
| | U | Not Used | | WDATA 00 | Z | |

TABLE 2

FPMA Control Port Map

| | Top | | | Bottom | | |
|---|---|---|---|---|---|---|
| Group | Port Type | Port Function | Placement in Array | Port Function | Port Type | Group |
| EMPTY | | Not Used | | Not Used | W | DIO |
| | | Not Used | FPGA | Not Used | X | |
| | | | Core | Not Used | V | |
| | | Not Used | Cell | Empty | Y | |
| | | Not Used | | Not Used | Z | |
| CLK | | Not Used | | Not Used | W | DIO |
| | N | RCLK | FPGA | Not Used | X | |
| | | | Core | Not Used | V | |
| | | Not Used | Cell | Full | Y | |
| | | Not Used | 1/2 FPGA | Not Used | Z | |
| CLK | | Not Used | Sector | Not Used | W | DIO |
| | N | WCKL | FPGA | Not Used | X | |
| | | | Core | Not Used | V | |
| | | Not Used | Cell | Almost Empty | Y | |
| | | Not Used | | Not Used | Z | |

TABLE 2-continued

FPMA Control Port Map

| | Top | | | Bottom | | |
|---|---|---|---|---|---|---|
| Group | Port Type | Port Function | Placement in Array | Port Function | Port Type | Group |
| RES | | Not Used | | Not Used | W | DIO |
| | O | RES | FPGA | Not Used | X | |
| | | | Core | Not Used | V | |
| | | Not Used | Cell | Almost Full | Y | |
| | | Not Used | | Not Used | Z | |

Connections Key, Tables 3–5

First Token:
  N, S, E, W—North, South, East, West
  G—Global Second Token:
  # —Local Bus Number
  F, G—Direct Connects Third Token:
  T, M, B—Top, Middle, Bottom
  In—Input
  Out—Output Stability: Ground or VDD

TABLE 3

Connectivity Map for Data In/Out Ports

| Port | | | | Connections | | | | | |
|---|---|---|---|---|---|---|---|---|---|
| W (out) | SFout | SGout | E4B | E2B | E3M | E1M | W4B | | Stability |
| X (in) | SFin | SGin | E3B | E1B | E4M | E2M | W1B | | Stability |
| V (bidi) | E3B | E2B | E1M | W3B | W2B | W1M | | | Stability |
| Y (out) | SGout | SFout | W3B | W1B | W4M | W2M | E1B | | Stability |
| Z (in) | SGin | SFin | W4B | W2B | W3M | W1M | E4B | | Stability |

TABLE 4

Connectivity Map for Control Ports

| Port | | | | Connections | | | | |
|---|---|---|---|---|---|---|---|---|
| R | | W2M | E4T | E2T | E3M | E1M | W4T | Stability |
| S | NFin | NGi | E3T | E1T | E4M | E2M | W1T | Stability |
| T | | E3M | W3T | W1T | W4M | W2M | E1T | Stability |
| U | NGin | NFi | W4T | W2T | W3M | W1M | E4T | Stability |

TABLE 5

Connectivity Map for Clock/Reset Ports

| Port | | | | Connections | | | | | |
|---|---|---|---|---|---|---|---|---|---|
| P | GC 1/5 | GC 2/4 | E4T | E2T | E3M | E1M | GC 3/7 | GC 4/8 | Stability |
| S | NFin | NGin | E3T | E1T | E4M | E2M | W1T | | Stability |
| Q | GR 1/5 | GR 2/4 | W3T | W1T | W4M | W2M | GR 3/7 | GR 4/8 | Stability |
| U | NGin | NFin | W4T | W2T | W3M | W1M | E4T | | Stability |

It will be evident to one of ordinary skill in the art that there are numerous ways of providing the connections required in the multiplexers, switches, bus turns, jumpers, etc. discussed above. For example, each jumper or bus turn could comprise a pass transistor, an EPROM, a fusible link or an antifuse which affects the desired isolation or connection between the conductors at the intersections. A user, upon requiring a connection at any particular intersection, would then only be required to perform the proper programming to effect the connection. A laser-programmed device could also employ optional welds at the intersection. The required connections are provided by either including or excluding the weld. A mask-programmed device would simply include or omit the relevant connections. Any structure for signal selection in which before programming, a plurality of signals are available for selection, and after programming, one of the signals is selected, is referred to herein as a multiplexer. A "connection," as used herein, and unless otherwise expressly indicated, broadly denotes either a direct, conductive connection between conductors, or an indirect (e.g., buffered/inverted) interface in which the information from one conductor is nevertheless supplied to the other conductor. Similarly, an "input" or an "output" denotes either a direct or indirect (e.g., buffered/inverted) interface, unless otherwise expressly indicated.

In a presently preferred embodiment, pass gates are employed for the jumpers, bus turns and multiplexers which are controlled by static random access memory ("SRAM") cells. The SRAM cells are directly or indirectly (through decoders) tied to the gates of the pass gates, thus controlling the state of the pass gates.

As discussed above, various technologies are known to those skilled in the art to provide array programmability. Any of these techniques, or variants thereof, can be used to program the array of the present invention. Mask programming techniques include customizing the deposition of the final layers of metallization of an otherwise generally designed integrated circuit (see, for example, U.S. Pat. No. 3,993,919 to Cox et al. entitled "Programmable Latch and Other Circuits for Logic Arrays," Nov. 23, 1976; and U.S. Pat. No. 4,742,383 to Fitzgerald entitled "Multi-Function FET Masterslice Cell," May 3, 1988; both patents assigned to the same assignee as the present application). Laser programming techniques involve customizing the metallization layers following their deposition (see, for example, Raffel et al., "A Wafer-Scale Digital Integrator Using Restructurable VSLI," IEEE Journal of Solid-State Circuits, Vol. SC-20, No. 1, February 1985, at pg. 399). Fusible links or antifuses can be employed and offer permanent (non-volatile) programming (see, for example, Millman, "Microelectronics," McGraw-Hill, Inc., 1979, at pg. 196; and U.S. Pat. No. 4,758,745 to El Gamal et al. entitled "User Programmable Integrated Circuit Interconnect Architecture and Test Method," Jul. 19, 1988). Erasable programmable read only memory ("EPROM") and electrically erasable programmable read only memory ("EEPROM") devices can be used and offer semi-permanent programming. EPROMS and EEPROMS are both electrically programmable and hold their states, even if power is removed. Special erase procedures can be used, however, to reconfigure the devices (see, for example, Wood et al., "An Electrically Alterable PLA for Fast Turnaround Time VLSI Development Hardware," IEEE Journal of Solid-State Circuits, Vol. SC-16, No. 5, October 1981, at pg. 570). Finally, volatile random access memory ("RAM") devices are also available which are fully programmable and reprogrammable, but which lose their programmed state if power is removed (see, for example, U.S. Pat. No. 4,177,452 to Balasubramanian et al., Dec. 4, 1979, assigned to the same assignee as the present application). These and other techniques for programming arrays are known to those in the art and are also generally described in the publication entitled "Field-Programmable Gate Arrays" by S. Brown, R. Francis, J. Rose and Z. Vranesic, Kluwer Academic Publishers, 1992. Each of the above-named sources is hereby incorporated herein by reference in its entirety.

Those skilled in the art will recognize that the exemplary rectangular core regions discussed above can be of any arbitrary size or shape, and that the principles of the present invention can apply equally to connections between such core regions along any or all sides thereof.

While the invention has been particularly shown and described with reference to preferred embodiment(s) thereof, it will be understood by those skilled in the art that various changes in form and details may be made therein without departing from the spirit and scope of the invention.

What is claimed is:

1. An interconnect structure for connecting logic cells of a programmable array to a core region within the array, the core region being generally characterized by circuits therein of a functional type different than that of the logic cells, the interconnect structure comprising:

a first row/column of ports for carrying signals to or from the core region and selectively connectable to logic cells of a first interior row/column of the logic cells, at least some ports of the row/column of ports positioned proximate a respective column/row of the logic cells, the at least some ports being selectively connectable to at least one interconnect bus associated with their respective column/row of logic cells;

wherein the core region is disposed in said array between first and second regions of the logic cells, the first region of logic cells including the first interior row/column of logic cells, the second region of logic cells including a second interior row/column of logic cells, the interconnect structure further comprising:

a second row/column of ports for carrying signals to or from the core region and selectively connectable to logic cells of the second interior row/column of logic cells, at least some ports of the second row/column of ports being positioned proximate a respective column/row of logic cells, the at least some ports of the second row/column of ports being selectively connectable to at least one interconnect bus associated with their respective column/row of logic cells;

wherein a given interconnect bus associated with a given column/row of logic cells of the logic cells includes:

a first portion traversing along the given column/row of logic cells within the first region of logic cells and having positioned therein in a regular pattern a first plurality of programmable devices for connecting conductors of the first portion to each other and to logic cells of the given column/row of logic cells;

a second portion traversing along the given column/row of logic cells within the second region of logic cells and having positioned therein in said regular pattern a second plurality of programmable devices for connecting conductors of the second portion to each other and to logic cells of the given column/row of logic cells;

an intermediate portion traversing the core region and disposed between the first and second portions;

a first programmable element for selectively connecting the first portion of the given interconnect bus to the intermediate portion of the given interconnect bus; and a second programmable element for selectively connecting the second portion of the given interconnect bus to the intermediate portion of the given interconnect bus.

2. The interconnect structure of claim 1, wherein the positions of the first and second programmable elements do not conform to the regular pattern of positions of the first and second pluralities of programmable devices along the first and second portions of the given interconnect bus.

3. The interconnect structure of claim 2, wherein ports of the first row/column of ports and proximate the given column/row of logic cells are selectively connectable to the first and intermediate portions of the given interconnect bus.

4. The interconnect structure of claim 3, wherein ports of the second row/column of ports and proximate the given column/row of logic cells are selectively connectable to the second and intermediate portions of the given interconnect bus.

5. The programmable array of claim 4, wherein the circuits of the core region comprise memory cells for cooperative functional operation with the logic cells.

6. The programmable array of claim 5, wherein individual ports of the first and second rows/columns of ports carry signals to or from the core region of a signal type chosen from a signal type group consisting of data, control and clock/reset, in order to operate the memory cells of the core region.

7. An interconnect structure for connecting a plurality of logic cells of a programmable array to a core region within the array, the core region being characterized by circuits therein of a functional type different than that of the plurality of logic cells, the plurality of logic cells including a first column/row of logic cells, the interconnect structure comprising:

at least one first interconnect bus running along said first column/row of logic cells and being selectively connectable to logic cells of said first column/row of logic cells;

a first port group positioned proximate said first column/row of logic cells, the ports of the first port group for transmitting signals to or from the circuits of the core region; and at least one first programmable port multiplexer coupled between the at least one first interconnect bus and said first port group for selectively transmitting signals between said first port group and conductors of the at least one first interconnect bus, wherein the core region is positioned between two interior logic cells of the first column/row of logic cells thereby defining first and second regions of logic cells in the first column/row of logic cells and first and second portions of the at least one first interconnect bus, wherein the at least one first programmable port multiplexer selectively transmits signals between the first port group and conductors of the first portion of the at least one first interconnect bus, the interconnect structure further comprising:

a second port group positioned proximate the first column/row of logic cells, the ports of the second port group for transmitting signals to or from the circuits of the core region; and at least one second programmable port multiplexer coupled between the second portion of the at least one first interconnect bus and said second port group for selectively transmitting signals between the second port group and conductors of the second portion of the at least one first interconnect bus;

wherein the at least one first interconnect bus comprises an intermediate portion positioned proximate the core region and between the first portion and the second portion of the at least one first interconnect bus, the at least one first programmable port multiplexer or the at least one second programmable port multiplexer for selectively transmitting signals between said intermediate portion and the respective first or second port group.

8. The interconnect structure of claim 7, wherein a first logic cell of the two interior logic cells between which the core region is positioned includes a plurality of direct connect conductors, at least some of which connect the first logic cell to logic cells adjacent thereto, the at least one first programmable port multiplexer being coupled between at least one of the plurality of direct connect conductors and the first port group for selectively transmitting signals therebetween.

9. The interconnect structure of claim 8, wherein the second logic cell of the two interior logic cells between which the core region is positioned includes a plurality of direct connect conductors, at least some of which connect the second logic cell to logic cells adjacent thereto, the at least one second programmable port multiplexer being coupled between at least one of the plurality of direct connect conductors of the second logic cell and the second port group for selectively transmitting signals therebetween.

10. The interconnect structure of claim 9, wherein the circuits of the core region comprise memory cells for cooperative functional operation with the plurality of logic cells.

11. The interconnect structure of claim 10, wherein individual ports of the first and second port groups carry signals to or from the core region of a signal type chosen from a signal type group consisting of data, control and clock/reset, in order to operate the memory cells of the core region.

12. An interconnect structure for connecting a plurality of logic cells of a programmable array to a core region within the array, the core region being characterized by circuits therein of a functional type different than that of the plurality of logic cells, the plurality of logic cells including a first column/row of logic cells, the interconnect structure comprising:

at least one first conductor coupled to a first logic cell of the column/row of logic cells;

a first port group positioned proximate said first column/row of logic cells, the ports of the first port group for transmitting signals to or from the circuits of the core region; and at least one first programmable port multiplexer coupled between said at least one first conductor and said first port group for selectively transmitting signals between said first port group and said at least one first conductor and therefore the first logic cell, wherein the plurality of logic cells includes a plurality of columns/rows of logic cells inclusive of the first column/row of logic cells and each having a respective first logic cell therein, the interconnect structure further including:

a first plurality of port groups inclusive of the first port group and each positioned proximate a respective column/row of said plurality of columns/rows of logic cells, the ports of the first plurality of port groups for transmitting signals to or from the circuits of the core region;

a first plurality of direct connect conductors inclusive of said at least one first conductor and including conductors coupled to the first logic cell of a respective column/row of logic cells; and a first plurality of programmable port multiplexers, inclusive of said first programmable port multiplexer, multiplexers of which are coupled between a respective one of the first plurality of direct connect conductors and a respective port group of the first plurality of port groups for selectively transmitting signals therebetween, wherein the core region is positioned between two interior rows/columns of logic cells comprising the plurality of columns/rows of logic cells thereby defining first and second regions of logic cells in said array, the first row/column of the two interior rows/columns of logic cells comprising the first logic cells, the interconnect structure further comprising:

a second plurality of direct connect conductors coupled to logic cells of a second row/column of the two interior rows/columns of logic cells;

a second plurality of port groups each positioned proximate a respective column/row of said plurality of columns/rows of logic cells, the ports of the second plurality of port groups for transmitting signals to or from the circuits of the core region; and a second plurality of programmable port multiplexers, multiplexers of which are coupled between a respective one of the second plurality of direct connect conductors and a respective port group of the second plurality of port groups for selectively transmitting signals therebetween.

13. The interconnect structure of claim 12, wherein the core region comprises a rectangular region positioned between the first and second regions of logic cells, and wherein:
- the first plurality of port groups and the first plurality of programmable port multiplexers are positioned in a regular pattern along one elongated edge of the core region; and
- the second plurality of port groups and the second plurality of programmable port multiplexers are positioned in the regular pattern along another elongated edge of the core region.

14. The interconnect structure of claim 12, further comprising:
- a first plurality of interconnect buses each running along a respective column/row of said plurality of columns/rows of logic cells and being selectively connectable to logic cells of its respective column/row of logic cells;
- wherein multiplexers of the first plurality of programmable port multiplexers selectively transmit signals between a first portion of a respective interconnect bus and a respective port group of the first plurality of port groups; and
- wherein multiplexers of the second plurality of programmable port multiplexers selectively transmit signals between a second portion of a respective interconnect bus and a respective port group of the second plurality of port groups.

* * * * *